(12) United States Patent  
Lin et al.

(10) Patent No.: US 6,706,423 B2
(45) Date of Patent: Mar. 16, 2004

(54) ORGANIC EL DEVICE (75) Inventors: Tung-Shen Lin, Tainan (TW); Kun-Tay Yeh, Tainan (TW)

(73) Assignee: Lightronik Technology Inc., Tainan (TW)

( * ) Notice: Subject to any disclaimer, the term of this patent is extended or adjusted under 35 U.S.C. 154(b) by 29 days.

(21) Appl. No.: 10/026,739

(22) Filed: Dec. 27, 2001

(65) Prior Publication Data

US 2003/0165712 A1 Sep. 4, 2003

(51) Int. Cl.$^7$ .............................................. H05B 33/12
(52) U.S. Cl. ....................... 428/690; 428/917; 313/504; 313/506
(58) Field of Search ................... 428/690, 917; 313/504, 506; 252/301.16; 548/469

(56) References Cited

U.S. PATENT DOCUMENTS

| | | | | |
|---|---|---|---|---|
| 5,281,489 A | * | 1/1994 | Mori et al. ................. | 428/690 |
| 6,111,063 A | | 8/2000 | Park et al. ................. | 528/423 |
| 6,124,046 A | | 9/2000 | Jin et al. ..................... | 428/690 |

FOREIGN PATENT DOCUMENTS

| | | |
|---|---|---|
| JP | 61-37890 | 2/1986 |
| JP | 01-245087 | 9/1989 |
| JP | 02-209988 | 8/1990 |
| JP | 02-247277 | 10/1990 |
| JP | 02-247278 | 10/1990 |
| JP | 03-33183 | 2/1991 |
| JP | 03-33184 | 2/1991 |
| JP | 03-47890 | 2/1991 |
| JP | 03-84089 | 4/1991 |
| JP | 03-231970 | 10/1991 |
| JP | 04-117485 | 4/1992 |
| JP | 04-275268 | 9/1992 |
| JP | 05-17765 | 1/1993 |
| JP | 05-140145 | 6/1993 |
| JP | 05-247459 | 9/1993 |
| JP | 5-339565 A | * 12/1993 |
| JP | 08-20771 | 1/1996 |
| JP | 08-40995 | 2/1996 |
| JP | 08-40997 | 2/1996 |
| JP | 08-53397 | 2/1996 |
| JP | 08-87122 | 4/1996 |
| JP | 09-157642 | 6/1997 |
| JP | 2000-91075 A | * 3/2000 |
| JP | 2001-291590 A | * 10/2001 |

OTHER PUBLICATIONS

W. Helfrich et al. "Transients of Volume–Controlled Current and of Recombination Radiation in Anthracene", J. of Chemical Phys. 44, 1966, pp. 2902–2909, no month.
C. W. Tang et al. "Organic Electroluminescent Diodes", Appl. Phys. Lett. 51, Sep. 21, 1987, pp. 931–915.
C. W. Tang et al. "Electroluminescence of Doped Organic Thin Films", J. Appl. Phys. 65, May 1, 1989, pp. 3610–3616.

* cited by examiner

*Primary Examiner*—Marie Yamnitzky
(74) *Attorney, Agent, or Firm*—Intellectual Property Solutions Incorporated (57) ABSTRACT

An organic electroluminescent (EL) device is disclosed, which includes an anode, a cathode, and at least one organic thin-film layer including a light emitting layer which contains a compound represented by the following general formula (1), (2) or (3):

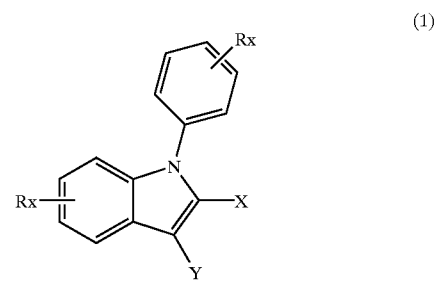

(1)

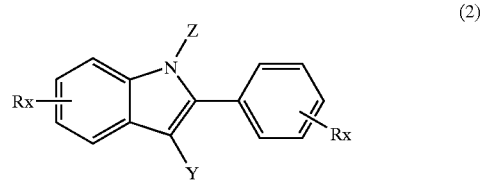

(2)

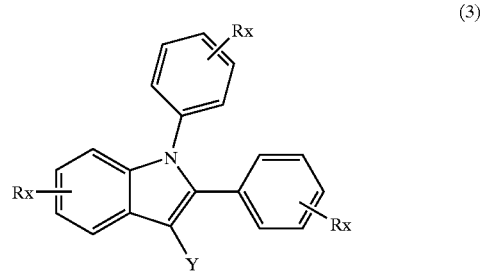

(3)

In these formulae, Y represents a connecting aromatic group and specific limitations are placed on Y, X, Z and Rx.

7 Claims, 3 Drawing Sheets

ORGANIC EL DEVICE

BACKGROUND OF THE INVENTION

1. Field of the Invention

This invention relates to a luminescent material for an organic EL device having light-emitting properties.

2. Description of the Related Art

An organic electroluminescent device (organic EL device) is a light emitting device, containing a fluorescent material which emits light in response to the recombination of hole and electron injected from anode and cathode. For example, C. W. Tang et al. reported an organic EL device using a double-layered structure (Applied Physics Letters, 51,913 (1987)). This organic EL device, which has a tris (8-hydroxyquinolinol aluminum) in a light-emitting layer and a triphenyldiamine derivative in a hole-transporting layer, greatly enhances the luminescence properties.

To further improve luminescence efficiency, a method of doping a fluorescent dye had been utilized. For example, an organic EL device with a coumarin dye as the doping material (Applied Physics Letters, 65,3610 (1989)) has been used to greatly improve the luminescence efficiency. For improving the recombination efficiency of the injected hole and electron, multi-layered devices have been introduced. As a hole-transporting material, triphenylamine derivatives such as 4,4',4"-tris(3-methylphenylphenylamino)-triphenylamine and aromatic diamine derivatives such as N,N'-diphenyl-N,N' bis (3-methylphenyl)-[1,1'-biphenyl]-4, 4'diamine are well known (see Japanese Patent Application Laid-Open Nos. 20771/1996, 40995/1996, 40997/1996, 53397/1996, 87122/1996). As an electron-transporting material, triazole derivatives and the like are also known.

Examples of the blue light emissive material for an organic EL device include condensed polycyclic aromatic compounds such as anthracene, pyrene and perylene (J. Chem. Phys., 44, 2902 (1996)), tetraphenylbutadiene-based compounds, distyrylbenzene-based compounds, stilbene-based compounds and polyphenyl-based compounds. (unexamined published Japanese patent application JP-A-61-37890, JP-A-1-245087, JP-A-2-247227, JP-A-2-247278, JP-A-2-209988, JP-A-3-33184, JP-A-3-84089, JP-A-3-231970, JP-A-4-117485, JP-A-4-275268, JP-A-5-17765, JP-A-140145, JP-A-3-47890, JP-A-3-33183, JP-A-5-247459 and JP-A-9-157642). However, these compounds have many problems involving durability, color purity, and luminescence efficiency.

SUMMARY OF THE INVENTION

An object of the present invention is to provide a high performance material and to provide an organic EL device having blue luminescence. The organic EL device comprises an anode, cathode, and one or more organic thin film layers which contain, either singly or as a mixture, an indole compound represented by the following formula (1), (2) or (3):

(1)

(2)

(3)

wherein Y represents an extending aromatic group of the following general formula (4), (5) or (6):

(4)

(5)

(6)

wherein $Ar_1$ group represents a substituted or unsubstituted aromatic hydrocarbon group or a substituted or unsubstituted aromatic heterocyclic group. X and Z represent a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group a substituted or unsubstituted aryloxy group or a substituted or unsubstituted alkoxycarbonyl group; and Rx is one or more functional groups represented by a hydrogen atom, halogen atom, nitro group, cyano group, carboxyl group, or X. Two Rx groups may form a ring.

DETAILED DESCRIPTION OF THE INVENTION

The present invention will hereinafter be described specifically. The indole compound represented by the following formula (1), (2) or (3) to be used for the organic EL device. For the Z groups, a substituted or unsubstituted aromatic hydrocarbon group or a substituted or unsubstituted aromatic heterocyclic group is a better choice. For the X groups, a substituted or unsubstituted aromatic hydrocarbon group or a substituted or unsubstituted aromatic heterocyclic group is also a better choice. Some examples of X groups are shown below, but the present invention is not limited thereto:

wherein the Rx groups are the same with above.

Y group means an extending aromatic group of the general formula (4), (5) or (6):

(4)

(5)

(6)

wherein the $Ar_1$ group represents a substituted or unsubstituted aromatic hydrocarbon group or a substituted or unsubstituted aromatic heterocyclic group. In formula (4), it means that $Ar_1$ connects with (1), (2) or (3) directly. In formula (5), it means that $Ar_1$ connects with (1), (2) or (3) with a carbon—carbon double bond. In formula (6), it means that $Ar_1$ connects with two units of (1), (2) or (3) with two carbon—carbon double bonds. Some examples of Y groups are shown below, but the present invention is not limited thereto:

wherein Rx is the same with above. A represents an oxygen atom, nitrogen atom or a sulfur atom.

Referring to the following reaction example, synthesis methods for the indole compound represented by the formula (1), (2) or (3) of the present invention will be described.

First, 2-substituted indole compound can be prepared by various methods shown below in scheme (1).

scheme (1)

Then, the Z group can be formed by the methods shown below in scheme (2).

As shown in scheme (3), an example of target indole compound can be prepared.

scheme (2)

Scheme (3)

Examples of the indole compounds represented by the formulae (1), (2) or (3) to be used in the organic EL device of the present invention are shown below, but the present invention is not limited thereto.

(1-1)

(1-2)

(1-3)

(1-4)

(1-5)

(1-6)

(1-7)

(1-8)

(1-9)

(1-12)

(1-10)

(1-11)

The organic EL device according to the present invention has a multi-layered structure including a light emitting layer, hole transporting layer, and electron transporting layer. Methods of selecting hole transporting material and electron transporting material are well known. Examples of hole transporting materials are shown below and represented by formula (A) through formula (E). Examples of electron transporting materials are shown below and represented by formula (F) through formula (J). The anode material of the organic EL device used in this present invention is indium tin oxide (ITO), and the cathode material is aluminum or calcium or both.

(A)

(B)

-continued

(C)

(D)

(E)

(F)

(G)

(H)

(I)

(J)

The present invention will hereafter be described in detail with reference to examples, but the present invention is not limited only to the following examples unless the spirit or scope of the invention is changed.

SYNTHESIS EXAMPLES

Example 1

Synthesis of compound (1—1). A solution of dry THF containing 2-phenylindole (1 mmole) was added NaH (1.1 mmole) and MeI (1.2 mmole, dropwise), and the reaction mixture was stirred at 65° C. for 3 h. After cooling to room temperature, the reaction mixture was poured into water and extracted with ether. The extracts was dried ($MgSO_4$) and evaporated under reduced pressure to give yellow-orange solid. Further purification by column chromatography on silica gel with hexane as an eluent gave a pale yellow solid of 1-methyl-2-phenylindole (79% yield). The solid product (0.7 mmole) was dissolved in DMF (10 ml), a mixture of $POCl_3$(0.09 mmole) and DMF (0.09 mmole) was added dropwise. After stirring at 75° C. for 1 h, the reaction mixture was added into saturate $NaHCO_3$ solution. The precipitated solid was collected by filtration and washed with ethanol to give a pale gray solid of 1-methyl-2-phenylindole-3-carboxaldehyde (85% yield). A dry DMF solution of the aldehyde (2 mmole) was added o-aminothiophenol (2.1 mmole) and $Ac_2O$ (0.5 ml) at room temperature. The mixture was stirred at 60° C. for 3 h. The reaction mixture was poured into stirred water and the precipitated solid was collected by filtration. The crude solid was washed with MeOH and recrystallized from benzene to afford compound 1-2 (38% yield). $^1$H-NMR ($CDCl_3$, TMS) δ(ppm)=3.6 (s, 3H, —$CH_3$), 7.3–7.8, 8.1, 8.9 (m, d, m, 13H, aromatic H).

Example 2

Synthesis of compound (1-4). A solution of dry o-dichlorobenzene containing 2-phenylindole (1 mmole) was added $K_2CO_3$ (1.5 mmole), 4-iodotoluene (1 mmole), copper powder (1.5 mmole) and 18-crown-6 (0.02 mmole), the reaction mixture was stirred under argon at 185° C. overnight. After cooling to room temperature, the reaction mixture was washed with hexane. The solid mixture was dissolved in EA, the $K_2CO_3$ and copper powder was removed by filtration. EA solution was evaporated under reduced pressure to give brown-red crude solid. Further purification by column chromatography on silica gel with hexane as an eluent gave a pale yellow solid of 1,2-diphenylindole (75% yield). The solid product (1 mmole) was dissolved in DMF (10 ml), a mixture of $POCl_3$ (1.2 mmole) and DMF (1.2 mmole) was added dropwise. After stirring at 75° C. for 1 h, the reaction mixture was added into saturate $NaHCO_3$ solution. The precipitated solid was collected by filtration and washed with ethanol to give a pale gray solid of 1,2-diphenylindole-3-carboxaldehyde (90% yield). A dry DMF solution of the aldehyde (2 mmole) was added o-aminothiophenol (2.1 mmole) and $Ac_2O$ (0.5 ml) at room temperature. The mixture was stirred at 60° C. for 3 h. The reaction mixture was poured into stirred water and the precipitated solid was collected by filtration. The crude solid was washed with MeOH and recrystallized from benzene to afford compound 1-4(32% yield). $^1$H-NMR ($CDCl_3$, TMS) δ(ppm)=2.4 (s, 3H, Ar—$CH_3$), 7.1–7.6, 8.2 (m, d, 17H, aromatic H).

Example 3

Synthesis of compound (1-10). A stirred mixture of 2-acetylfluorene (0.1 mmole), phenylhydrazine (0.11 mmole) and phosphoric acid (150 g) was heated to 150° C. for 30 mins. After cooling to room temperature, the reaction was poured into cooling water and extracted with ether. The extract was dried ($MgSO_4$) and evaporated under reduced pressure to give yellow solid. The crude solid was recrystallized from EA to get pale yellow solid of 2-fluorene indole (35% yield). A solution of dry THF containing 2-fluorene indole (0.1 mmole) was added t-BuOK (0.11 mmole) and MeI (0.12 mmole, dropwise), and the reaction mixture was stirred at 65° C. for 3 h. After cooling to room temperature, the reaction mixture was poured into water and extracted with ether. The extract was dried ($MgSO_4$) and evaporated under reduced pressure to give yellow solid. Further purification by washing with EA to get pale yellow solid of 1-methyl-2-fluorene indole (62% yield). The solid product (0.1 mmole) was dissolved in DMF (5 ml), a mixture of POCl$_3$ (0.12 mmole) and DMF (0.12 mmole) was added dropwise. After stirring at 75° C. for 1 h, the reaction mixture was added into saturate NaHCO$_3$solution. The precipitated solid was collected by filtration and washed with ethanol to give a pale pink-yellow solid of 1-methyl-2 fluorene indole-3-carboxaldehyde (82% yield). A dry DMF solution of the aldehyde (2 mmole) was added diethyl benzylphosphonate (2.1 mmole) and t-BuOK (2.2 mmole) at room temperature. The mixture was stirred at 75° C. for 3 h. The reaction mixture was poured into stirred water and the precipitated solid was collected by filtration. The crude solid was washed with MeOH and recrystallized from benzene to afford compound 1-10(58% yield). $^1$H-NMR (CDCl$_3$, TMS) δ(ppm)=3.8 (s, 3H, —CH$_3$), 4.0 (s, 2H, fluorine 2H), 7.1–7.9 (m, 18H, aromatic H, Ar—CH═CH—Ar).

Example 4

Synthesis of compound (1-12). A solution of dry THE containing 2-phenylindole (1 mmole) was added NaH (1.1 mmole) and MeI (1.2 mmole, dropwise), and the reaction mixture was stirred at 65° C. for 3 h. After cooling to room temperature, the reaction mixture was poured into water and extracted with ether. The extract was dried (MgSO$_4$) and evaporated under reduced pressure to give yellow-orange solid. Further purification by column chromatography on silica gel with hexane as an eluent gave a pale yellow solid of 1-methyl-2-phenylindole (79% yield). The solid product (0.7 mmole) was dissolved in DMF (10 ml), a mixture of POCl$_3$ (0.09 mmole) and DMF (0.09 mmole) was added dropwise. After stirring at 75° C. for 1 h, the reaction mixture was added into saturate NaHCO$_3$ solution. The precipitated solid was collected by filtration and washed with ethanol to give a pale gray solid of 1-methyl-2-phenylindole-3-carboxaldehyde (85% yield). A dry DMF solution of the aldehyde (2 mmole) was added 4-benzothiazolyl-diethyl benzylphosphonate (2.1 mmole) and t-BuOK (2.2 mmole) at room temperature. The mixture was stirred at 75° C. for 3 h. The reaction mixture was poured into stirred water and the precipitated solid was collected by filtration. The crude solid was washed with MeOH and recrystallized from benzene to afford compound 1-12(63% yield). $^1$H-NMR (CDCl$_3$, TMS) δ (ppm)=3.6 (s, 3H, —CH$_3$), 6.9–7.7, 8.2 (m, d, 19H, aromatic H, Ar—CH═CH—Ar).

The present invention regarding production of organic EL device is further discussed below. Examples of used glass substrates with ITO electrode having a surface resistance of 20 (Ω/square) as the anode, calcium and aluminum film as the cathode are illustrated.

DEVICE EXAMPLES

Example 1

Figure 1:
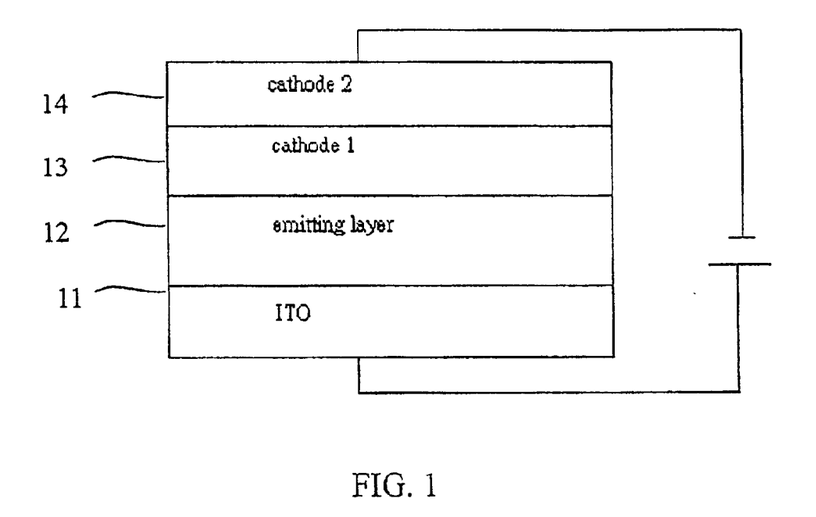
FIG. 1 illustrates a construction of an organic EL element of the present invention.

As the structure shown in FIG. 1, 80 mg PVK (poylvinylcarbazole), 15 mg compound (H) and 3 mg compound (1-1) are dissolved in 10 ml 1,2-dichloroethane. An organic thin film is formed by spin coating on the anode 11 as an emitting layer 12. An 1 nm of calcium layer 13 is formed by vacuum deposition on the organic layer 12 as the cathode 1. Moreover, an aluminum cathode 14 is formed by vacuum deposition on the cathode 1 as the cathode 2. When a dc voltage 21V is applied to the resulting device, a 130 cd/m$^2$ brightness light emission is obtained. In a similar manner as applied to example 1, example 2 through example 4 are fabricated and the results listed in Table 1 as follows:

TABLE 1

| Example | Compound | Brightness (cd/m$^2$) |
|---------|----------|-----------------------|
| 1 | 1-1 | 130 |
| 2 | 1-4 | 145 |
| 3 | 1-10 | 105 |
| 4 | 1-12 | 150 |

Example 5

Figure 2:
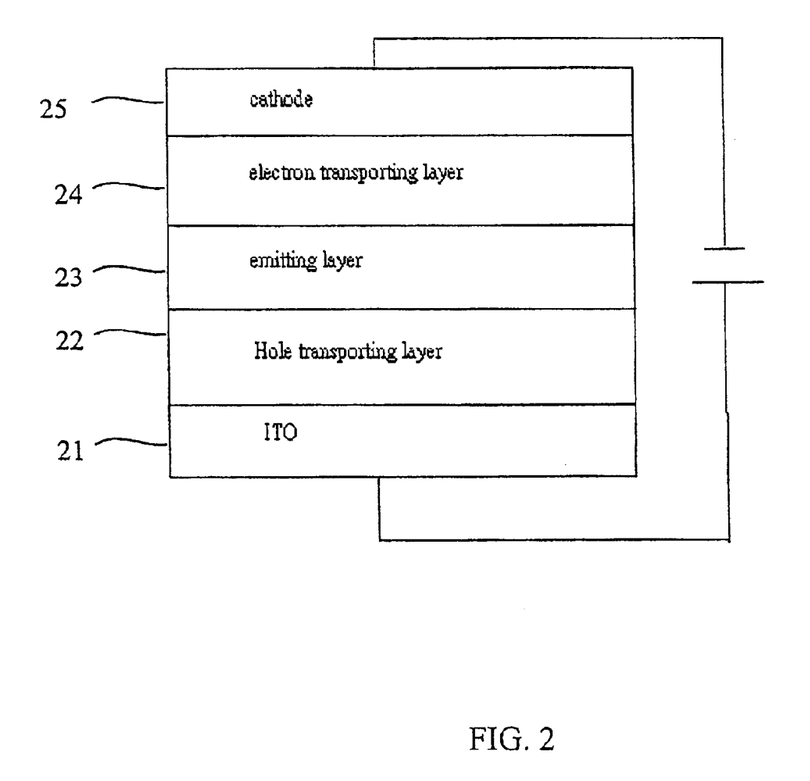
FIG. 2 illustrates another construction of an organic EL element of the present invention.

As shown in FIG. 2, a 50 nm hole-transporting layer 22 is formed by vacuum deposition of compound (B) on the ITO 21. Over the hole-transporting layer 22, a 10 nm emitting layer 23 is formed by vacuum deposition of compound (1-1). Then, a 30 nm electron-transporting layer 24 is formed by vacuum deposition of compound (H) on the emitting layer 23. Finally, a 200 nm aluminum cathode 25 is formed by vacuum deposition on the organic layer 24. When a dc voltage of 15 V is applied to the resulting device, a 420 cd/m$^2$ brightness light emission is obtained. In a similar manner as applied to example 5, example 6 through example 8 are fabricated and the results listed in Table 2 as follows:

TABLE 2

| Example | Compound | Brightness (cd/m$^2$) |
|---------|----------|-----------------------|
| 5 | 1-1 | 420 |
| 6 | 1-4 | 450 |
| 7 | 1-10 | 310 |
| 8 | 1-12 | 560 |

Example 9

As shown in FIG. 2, a 50 nm hole-transporting layer 22 is formed by vacuum deposition of compound (B) on the ITO 21. Over the hole-transporting layer 22, a 10 nm emitting layer 23 is formed by vacuum deposition of compound (1-1). Then, a 30 nm electron-transporting layer 24 is formed by vacuum deposition of compound (J) on the emitting layer 23. Finally, a 200 nm aluminum cathode 25 is formed by vacuum deposition on the organic layer 24. When a dc voltage of 15 V is applied to the resulting device, a 1350 cd/m$^2$ brightness light emission is obtained. In a similar manner as applied to example 9, example 10 through example 12 are fabricated and the results listed in Table 3 as follows:

TABLE 3

| Example | compound | Brightness (cd/m$^2$) |
|---------|----------|-----------------------|
| 9 | 1-1 | 1350 |
| 10 | 1-4 | 1520 |
| 11 | 1-10 | 1020 |
| 12 | 1-12 | 1700 |

Example 13

Figure 3:
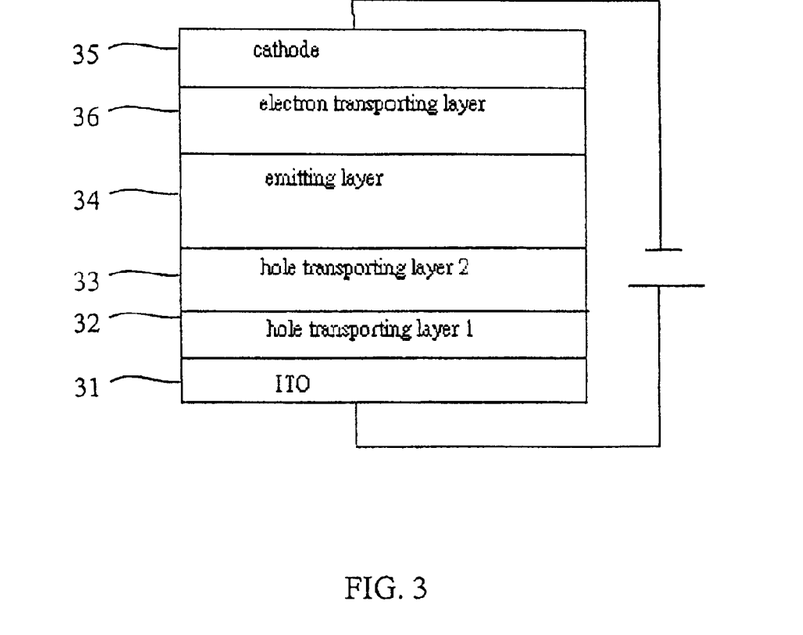
FIG. 3 illustrates yet another construction of an organic EL element of the present invention.

As shown in FIG. 3, a 30 nm hole-transporting layer 32 is formed by vacuum deposition of compound (D) on the ITO 31 as the hole-transporting layer 1. Over the hole-transporting layer 32, a 40 nm of hole-transporting layer 33 is formed by vacuum deposition of compound (B) as the hole-transporting layer 2. A 5 nm emitting layer 34 is formed by vacuum deposition a compound (1-1) on the hole-transporting layer 33. Then, a 30 nm electron-transporting layer 35 is formed by vacuum deposition of compound (H) on the emitting layer 34. Finally, a 200 nm aluminum cathode 36 is formed by vacuum deposition on the electron-transporting layer 35. When a dc voltage of 15 V is applied to the resulting device, a 2100 cd/m² brightness light emission is obtained. In a similar manner as applied to example 13, example 14 through example 16 are fabricated and the results listed in Table 4 as follows:

TABLE 4

| Example | compound | Brightness (cd/m²) |
|---------|----------|---------------------|
| 13 | 1-1 | 2100 |
| 14 | 1-4 | 2250 |
| 15 | 1-10 | 1800 |
| 16 | 1-12 | 2800 |

Example 17

Figure 4:
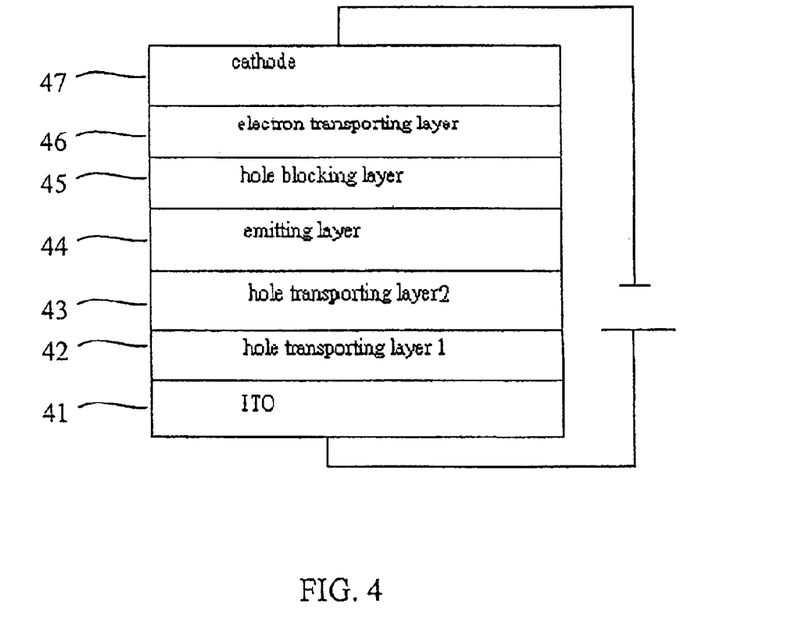
FIG. 4 illustrates still another construction of an organic EL element of the present invention.

As shown in FIG. 4, a 30 nm hole-transporting layer 42 is formed by vacuum deposition of compound (D) on the ITO 41 as the hole-transporting layer 1. Over the hole-transporting layer 42, a 40 nm hole-transporting layer 43 is formed by vacuum deposition of compound (B) as the hole-transporting layer 2. A 5 nm emitting layer 44 is formed by a vacuum deposition of compound (1-1) on the hole-transporting layer 43. Then, an 8 nm hole blocking layer 45 is formed by vacuum deposition of compound (H) on the emitting layer 44. Moreover, a 30 nm electron-transporting layer 46 is formed by vacuum deposition of compound (J) on the hole blocking layer 45. Finally, a 200 nm aluminum cathode 47 is formed by vacuum deposition on the electron-transporting layer 46. When a dc voltage of 15 V is applied to the resulting device, a 2250 cd/m² brightness light emission is obtained. In the similar manner as applied to example 17, example 18 through example 20 are fabricated and the results listed in Table 5 as follows:

TABLE 5

| Example | compound | Brightness (cd/m²) |
|---------|----------|---------------------|
| 17 | 1-1 | 2250 |
| 18 | 1-4 | 2380 |
| 19 | 1-10 | 1750 |
| 20 | 1-12 | 3020 |

Example 21

Figure 5:
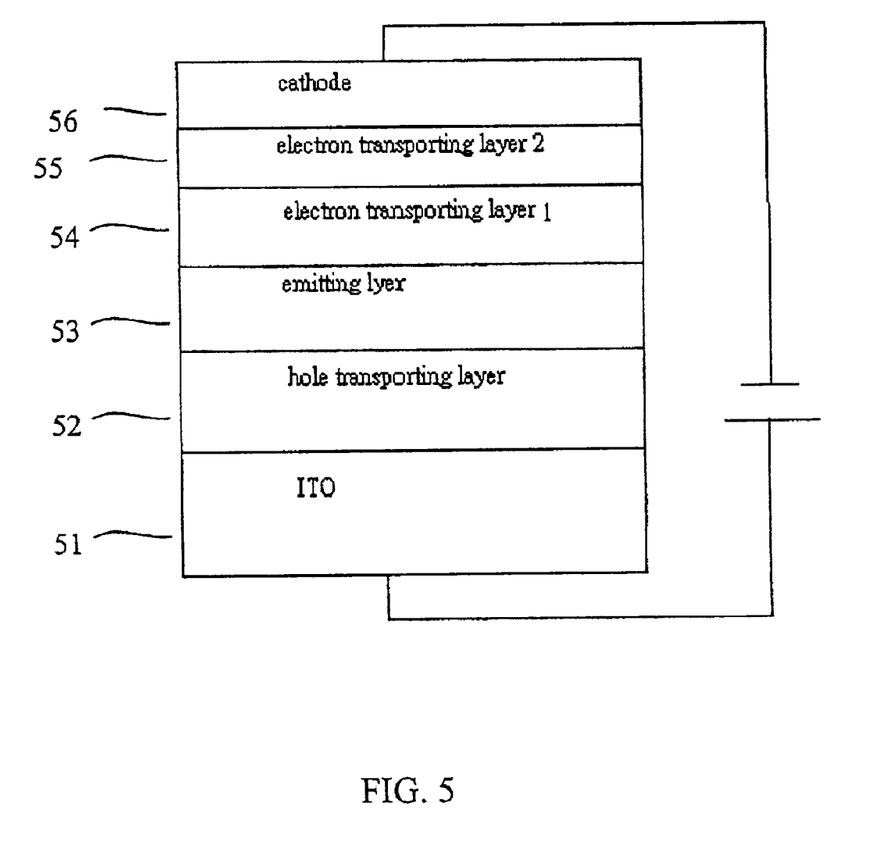
FIG. 5 illustrates yet still another construction of an organic EL element of the present invention.

As shown in FIG. 5, a 40 nm of hole-transporting layer 52 is formed by vacuum deposition of compound (B) on the ITO 51. A 10 nm emitting layer 53 is formed by vacuum deposition of compound (1-1) on the hole-transporting layer 52. A 30 nm electron-transporting layer 54 is formed by vacuum deposition of compound (J) on the emitting layer 53 as the electron-transporting layer 1. Then, a 0.8 nm electron-transporting layer 55 is formed by vacuum deposition of LiF on the electron-transporting layer 54 as the electron-transporting layer 2. Finally, a 200 nm aluminum cathode 56 is formed by vacuum deposition on the electron-injection layer 55. When a dc voltage of 15 V is applied to the resulting device, a 2350 cd/m² brightness light emission is obtained. In the similar manner as applied to example 21, example 22 through example 24 are fabricated and the results listed in Table 6 as follows:

TABLE 6

| Example | compound | Brightness (cd/m²) |
|---------|----------|---------------------|
| 21 | 1-1 | 2350 |
| 22 | 1-4 | 2500 |
| 23 | 1-10 | 1850 |
| 24 | 1-12 | 2900 |

What is claimed is:
1. An organic EL device comprising:

an anode;

a cathode; and one or more than one organic thin film layers including a light emitting layer adjacent to said anode and said cathode;

wherein at least one of the said organic thin film layers contains a compound represented by the following formula (1), (2) or (3) or a mixture thereof:

(1)

(2)

(3)

wherein Y represents an extending aromatic group of the following general formula (4A), (5) or (6):

(4a)

(5)

(6)

wherein Ar₁ group represents a substituted or unsubstituted aromatic hydrocarbon group or a substituted or unsubstituted aromatic heterocyclic group; A represents a sulfur atom or NH group; X and Z represent a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group or a substituted or unsubstituted alkoxycarbonyl group; and Rx is one or more functional groups represented by a hydrogen atom, a halogen atom, a nitro group, a cyano group, a carboxyl group, or X; and two of said Rx groups may form a ring.

2. An organic EL device comprising:

an anode;

a cathode; and one or more than one organic thin film layers including a light emitting layer adjacent to said anode and said cathode;

wherein at least one of the said organic thin film layers contains a compound represented by formula (1), (2) or (3) or a mixture thereof

(1)

(2)

(3)

wherein Y represents an extending aromatic group of the following general formula (4):

(4)

wherein Ar₁ group represents a substituted or unsubstituted aromatic heterocyclic group; X and Z represent a substituted or unsubstituted alkyl group, a substituted or unsubstituted alkenyl group, a substituted or unsubstituted aromatic hydrocarbon group, a substituted or unsubstituted aromatic heterocyclic group, a substituted or unsubstituted amino group, a substituted or unsubstituted alkoxy group, a substituted or unsubstituted aryloxy group, or a substituted or unsubstituted alkoxycarbonyl group; and Rx is one or more functional groups represented by a hydrogen atom, a halogen atom, a nitro group, a cyano group, a carboxyl group, or X; and two of said Rx groups may form a ring.

3. An organic EL device comprising:

an anode;

a cathode; and one or more than one organic thin film layers including a light emitting layer adjacent to said anode and said cathode;

wherein at least one of the said organic thin film layers contains a compound represented by formula (1), (2) or (3) or a mixture thereof:

wherein Y represents an extending aromatic group of general formula (4):

(4)

wherein Ar₁ group represents a substituted or unsubstituted aromatic hydrocarbon group; X represents a substituted or unsubstituted alkyl group, a substituted or unsubstituted aromatic heterocyclic group, a substituted or unsubstituted amino group, a substituted or unsubstituted alkoxy group, a substituted or unsubstituted aryloxy group or a substituted or unsubstituted alkoxycarbonyl group; Z represents a substituted or unsubstituted alkenyl group, a substituted or unsubstituted aromatic heterocyclic group, a substituted or unsubstituted amino group, a substituted or unsubstituted alkoxy group, a substituted or unsubstituted aryloxy group or a substituted or unsubstituted alkoxycarbonyl group; and Rx is one or more functional groups represented by a halogen atom, a nitro group, a cyano group, a carboxyl group, or X; and two of said Rx groups may form a ring.

4. The organic EL device as set forth in one of claim 1, 2 or 3, wherein said organic thin film layers comprise a light-emitting layer and one or more hole-transporting layers, and at least one of the said organic thin film layers contains a compound of said formula (1), (2) or (3).

5. The organic EL device as set forth in one of claim 1, 2 or 3, wherein said organic thin film layers comprise a light emitting layer and one or more electron-transporting layers, and at least one of the said organic thin film layers contains a compound of said formula (1), (2) or (3).

6. The organic EL device as set forth in one of claim 1, 2 or 3, wherein said organic thin film layers comprise one or more hole-transporting layers, a light emitting layer and one or more electron-transporting layers, and at least one of the said organic thin film layers contains a compound of said formula (1), (2) or (3).

7. The organic EL device as set forth in one of claim 1, 2 or 3, wherein said organic thin film layers comprise one or more hole-transporting layers, a light emitting layer, a hole-blocking layer and one or more electron-transporting layers, and at least one of the said organic thin film layers contains a compound of said formula (1), (2) or (3).

* * * * *